(12) United States Patent
Schmidt et al.

(10) Patent No.: US 9,299,473 B2
(45) Date of Patent: Mar. 29, 2016

(54) COMPOSITE ELECTRICALLY CONDUCTIVE STRUCTURES

(71) Applicant: Hamilton Sundstrand Corporation, Charlotte, NC (US)

(72) Inventors: Wayde R. Schmidt, Pomfret Center, CT (US); Sameh Dardona, South Windsor, CT (US)

(73) Assignee: HAMILTON SUNDSTRAND CORPORATION, Windsor Locks, CT (US)

(*) Notice: Subject to any disclaimer, the term of this patent is extended or adjusted under 35 U.S.C. 154(b) by 101 days.

(21) Appl. No.: 13/915,038

(22) Filed: Jun. 11, 2013

(65) Prior Publication Data

US 2014/0363677 A1  Dec. 11, 2014

(51) Int. Cl.
*H01B 1/02* (2006.01)
*H01B 1/04* (2006.01)
*H01B 7/00* (2006.01)

(52) U.S. Cl.
CPC .. *H01B 1/04* (2013.01); *H01B 1/02* (2013.01); *H01B 1/023* (2013.01); *H01B 1/026* (2013.01); *H01B 7/0018* (2013.01); *Y10T 428/30* (2015.01)

(58) Field of Classification Search
USPC .............. 174/126, 1; 428/408, 457; 977/700
See application file for complete search history.

(56) References Cited

U.S. PATENT DOCUMENTS

| 7,071,258 | B1* | 7/2006 | Jang et al. ............... 977/755 |
| 7,875,801 | B2* | 1/2011 | Tsotsis ................... 174/126.1 |
| 8,445,788 | B1 | 5/2013 | Tsotsis et al. |
| 8,835,046 | B2* | 9/2014 | Liu et al. .................. 423/448 |
| 8,937,254 | B2* | 1/2015 | Wen et al. ................ 174/113 R |
| 2009/0211901 | A1* | 8/2009 | Kajiura et al. ............ 428/408 |
| 2010/0055464 | A1* | 3/2010 | Sung ...................... 428/408 |
| 2010/0170694 | A1 | 7/2010 | Tsotsis et al. |
| 2010/0218801 | A1* | 9/2010 | Sung et al. ............... 977/734 |
| 2011/0045282 | A1* | 2/2011 | Kelber ..................... 977/734 |
| 2012/0088154 | A1* | 4/2012 | Liu et al. ................. 977/734 |
| 2012/0251881 | A1* | 10/2012 | Woehrle et al. .......... 977/948 |
| 2012/0305165 | A1* | 12/2012 | Liu et al. ................. 977/734 |
| 2013/0025907 | A1 | 1/2013 | Zheng et al. |

FOREIGN PATENT DOCUMENTS

GB          1282904      7/1972
WO    2013127444 A1     9/2013

OTHER PUBLICATIONS

Wang et al "Ternary Self-Assembly of Ordered Mateal Oxide-Graphene Nanocomposites for Electrochemical Energy Storage" Acsnano vol. 4 No. 3 (2010) p. 1587-1595.*
Liu et al "Direct Growth of Graphene/Hexagonal Boron Nitride Stacked Layer" Nano Lett vol. 11 (2011) p. 2032-2037.*
Ci et al "Atomic layers of hybridized boron nitride and graphene domains" Nature (2010) p. 1-6.*
European Search Report for Application No. 14170830.5-1801; date of mailing Oct. 31, 2014.

* cited by examiner

*Primary Examiner* — Archene Turner
(74) *Attorney, Agent, or Firm* — Cantor Colburn LLP

(57) ABSTRACT

An electrically conductive structure including a substrate material and graphene. A first cross-section taken along an axial direction of the electrically conductive structure includes a plurality of layers of the substrate material and at least one internal layer of the graphene alternatingly disposed between the plurality of layers of the substrate material. A method of tailoring an amount of graphene in an electrically conductive structure is also included.

13 Claims, 2 Drawing Sheets

COMPOSITE ELECTRICALLY CONDUCTIVE STRUCTURES

BACKGROUND OF THE INVENTION

The subject matter disclosed herein relates to electrically conductive structures and, in particular, to composite electrically conductive structures including graphene and a substrate material.

Wires and other electrically conductive structures are utilized to enable the transmission of power and/or electrical signals. Different operating conditions lead to different types or sizes of wires being used.

SUMMARY

According to one embodiment, an electrically conductive structure is disclosed. The electrically conductive structure includes a substrate material and graphene. A first cross-section taken along an axial direction of the electrically conductive structure includes a plurality of layers of the substrate and at least one internal layer of the graphene alternatingly disposed between the plurality of layers of the substrate material.

According to another embodiment, a method of tailoring an amount of graphene in an electrically conductive structure is disclosed. The method includes disposing graphene with a substrate material and arranging the graphene and the substrate material to form the electrically conductive structure such that a cross-section of the electrically conductive structure taken in a longitudinal direction of the electrically conductive structure includes a plurality of layers of the substrate material and at least one internal layer of the graphene disposed alternatingly between the plurality of layers of the substrate.

BRIEF DESCRIPTION OF THE DRAWINGS

The subject matter, which is regarded as the invention, is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION OF THE INVENTION

A detailed description of one or more embodiments of the disclosed apparatus and method are presented herein by way of exemplification and not limitation with reference to the Figures.

The invention relates generally to wires and other electrically conductive structures. These electrically conductive structures are arranged to enable the transmission of power and/or electrical signals. The electrically conductive structures comprise a composite of graphene and an electrically conductive substrate, such as copper, aluminum, nickel, steel, or another metal. Non metallic, electrically conductive substrates such as ceramics, plastics and glasses are also contemplated.

As used herein, graphene may refer specifically to a single atom-thick layer of carbon atoms arranged in a hexagonal pattern, and more generally to any combination of such atom-thick hexagonally patterned carbon layers disposed together, or a nanostructure made from one or more such layers, e.g., multilayered sheets, platelets or graphene nanotubes. While graphene is often praised for its low density, corrosion resistance, and high thermal and electrical conductivity, it is currently unfeasible to produce entire electrically conductive structures suitable for use in power and/or signal transmission, e.g., wires, solely from graphene. According to one embodiment, a substrate material (e.g. a wire or other electrically conductive element) can be included to provide structural integrity to the electrically conductive graphene structure. Graphene can be applied to a conductive substrate material in any known, desired, or discovered manner, such as vapor deposition, mechanical work, sintering substrate particles with graphene particles, combining, embedding, or distributing graphene layer portions or "chunks" into a bulk of liquid or molten substrate, etc.

Figure 6:
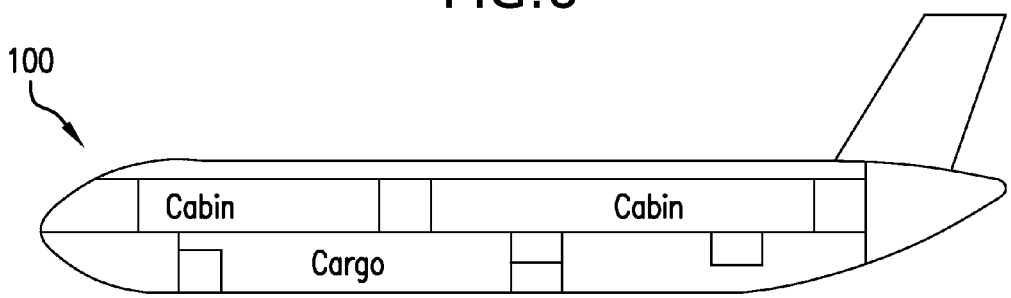
FIG. 6 schematically illustrates an aircraft employing electrically conductive structures according to embodiments disclosed herein.

Aircraft include a myriad of components that must be connected by electrically conductive structures capable of reliable and high load data and power transmission, and a copper or other conductive metal substrate wire or cable imbued with graphene will enable higher power loads and more efficient power transmission, which can in turn lead to performance enhancements, e.g., increased fuel economy, for the aircraft. For example, in the embodiment of FIG. 6, the electrically conductive structures, e.g., as discussed below, are utilized to transmit power, data, and/or electrical signals within components of an aircraft 100. For example, the aircraft 100 includes several components which may be in data, power, and/or signal communication with each other or other components of the aircraft 100 and connected by the electrically conductive structures disclosed herein.

Figure 1:
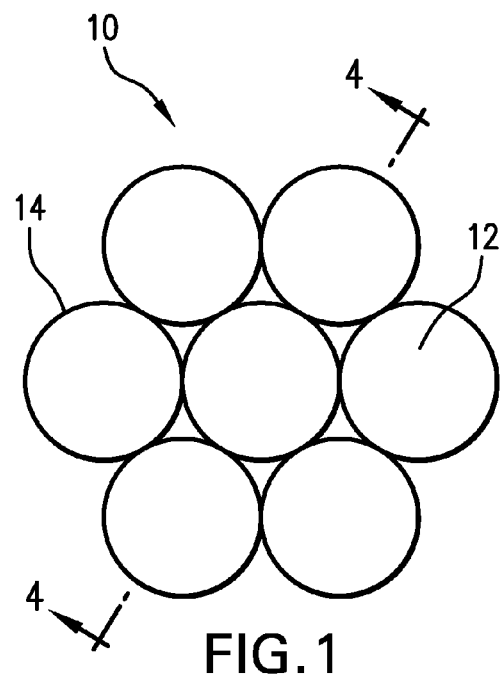
FIG. 1 is a cross-sectional view of an electrically conductive structure in the form of a wire bundle taken generally perpendicular to a longitudinal or axial direction of the electrically conductive structure.

Other devices, machines, and mechanisms can similarly benefit from composite structures. To this end, embodiments discussed herein involve the maximization of the amount of graphene and/or tailoring of the ratio of graphene to substrate material that can be achieved in an electrically conductive structure, e.g., in order to enable a balancing between the properties of the two materials. In one embodiment, the graphene is in an amount of about 5% to 40% per unit volume (and/or unit area with respect to a cross-section of the electrically conductive structure taken perpendicular to its axial or longitudinal direction (e.g., as shown in FIG. 1). In a further embodiment, the graphene is in an amount of about 15% to 30% per unit volume (and/or unit area as noted above), which provides a good balance of decreased power dissipation and structural or mechanical integrity in comparison to a conductive structure made solely from the substrate material.

FIG. 1 illustrates one embodiment for an electrically conductive structure, which takes the specific form of a wire bundle 10. The bundle 10 is shown in cross-section in FIG. 1, and it is to be appreciated that the wire bundle 10 can extend any desired longitudinal or axial length, e.g., in order to couple between two electric components for enabling power and/or data transmission therebetween. The wire bundle 10 is formed from a plurality of strands, wires, bars, rods, or fibers 12 (generally, the strands 12) disposed with a coating, film, layer, or lamination 14 (generally, the coating 14) at least partially thereon. The strands 12 are at least partially made of an electrically conductive substrate material, e.g., copper, aluminum, nickel, steel, etc., while the coating 14 is made of graphene or a graphene precursor that can be processed into graphene, e.g., graphene oxide. As used herein, "graphene" may generally refer to graphene in the forms discussed above as well as relatives and/or precursors to graphene, e.g., graphene oxide, which exhibit properties of graphene and/or can be processed into graphene.

In one embodiment each of the strands 12, or selected ones of the strands 12, are individually coated with the graphene coating 14 before arranging the strands 12 together to form the bundle 10, while in another embodiment the strands 12 are first bundled together and then the graphene coating 14 is applied to the bundle. The strands 12 can take any desired dimension, e.g., milli-scale, micro-scale, nano-scale, etc. The strands 12 can be arranged longitudinally parallel to each other, intertwined, helixed or spiraled about each other or an axis, etc. In one embodiment, the strands 12 are made essentially entirely from an electrically conductive substrate material. In one embodiment, the bundle 10 is nano-scale with some of the strands 12 being individual nano-sized copper or other metal strands and others of the strands 12 being individual graphene nano-tubes or other graphene nano-structures. In one embodiment, the wire bundle 10 is additionally coated or disposed within a protective, non-conductive sheath or conduit. In one embodiment, the electrically conductive structure is formed as a ribbon of the strands 12, e.g., by arranging the strands 12 adjacent to each other along an essentially straight line (instead of concentrically about an axis). Similarly, to the above, the individual ones of the strands 12 can be coated with the graphene coating 14, or the ribbon can be so coated after arranging the strands 12 together.

Figure 2:
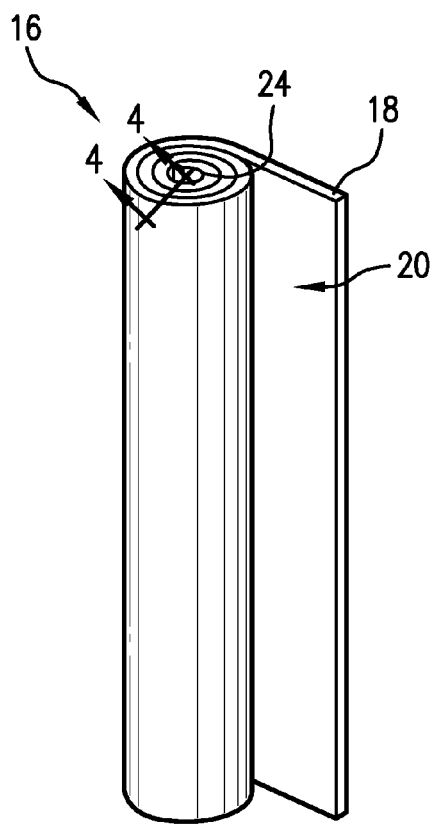
FIG. 2 is a perspective view of an electrically conductive structure in the form of a tube.
Figure 3:
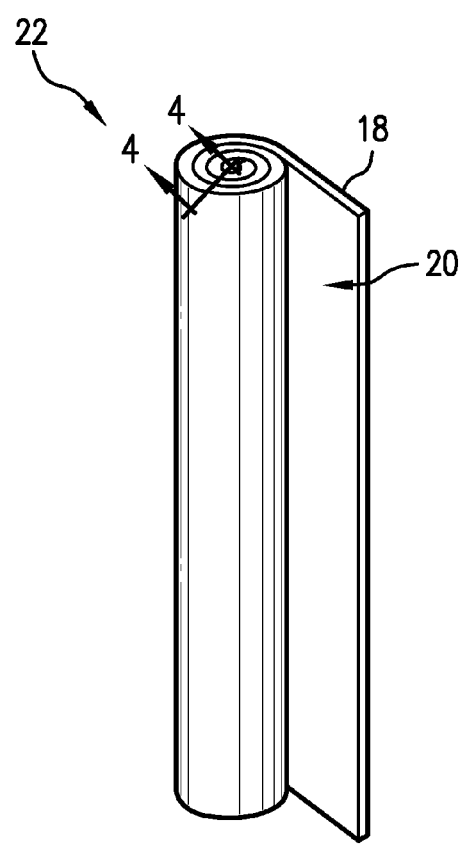
FIG. 3 is a perspective view of an electrically conductive structure in the form of a wire.

FIGS. 2 and 3 illustrate electrically conductive structures according to two additional embodiments. Specifically, FIG. 2 illustrates a tube 16 formed from a sheet, foil, or plate 18 (generally, the sheet 18) having a graphene coating, layer, film, or lamination 20 (generally, the coating 20) disposed at least partially thereon, while FIG. 3 illustrates a wire, strand, or fiber 22 (generally, the wire 22) similarly formed from the sheet 18 and the coating 20. The coating 20 of graphene can be provided at least partially on one or both of the major surfaces of the sheet 18. The sheet 18 is rolled, wrapped, or spiraled about a cavity 24 to form the tube 16 or tightly rolled or spiraled to form the wire 20. It is to be appreciated that the sheet 18, similar to the strands 12, at least partially comprises a substrate material and can be any desired thickness, etc., milli-scale, micro-scale, nano-scale, etc. In one embodiment, a plurality of the sheets 18 and the coatings 20 are alternatingly stacked atop each other and then rolled to form a wire, tube, strand, fiber, etc. In one embodiment, one or more of the sheets 18 are arranged without rolling or wrapping, i.e., to form the electrically conductive structure as a ribbon.

Figure 4:
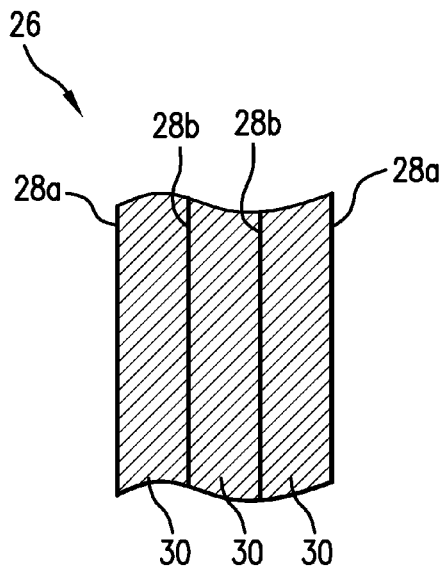
FIG. 4 is a cross-sectional view of a representative electrically conductive structure taken generally in a longitudinal direction of the electrically conductive structure, and generally represents each of the electrically conductive structures of FIGS. 1-3 taken along the lines 4-4 in those Figures.

A cross-section of a representative composite electrically conductive structure 26 is provided in FIG. 4 to better describe various embodiments described herein. The cross-section is taken parallel to, or along, the longitudinal direction of the structure 26 (e.g., along the length of a wire, cable, etc. formed by the structure 26). In cross-section the structure 26 includes alternating layers, laminas, or regimes (generally layers) of graphene represented with the base numeral 28, and of substrate material represented with the base numeral 30.

Alphabetic identifiers 'a' and 'b' are used with the base numerals 28 to identify different types of the graphene layers 28. Namely, the graphene layers 28 include two exterior layers 28a, and two internal layers 28b. By internal layer, it is meant that the layers 28b are sandwiched, flanked by, or disposed between two of the layers 30.

The structure 26 as illustrated in FIG. 4 can generally represent any of the wire bundle 10, tube 16, wire 22, or structures according to other embodiments, e.g., as taken along the lines 4-4 in FIGS. 1-3, respectively. For example, in one embodiment the structure 26 represents the wire bundle 10, with the graphene layers 28 representing the coating 14 and the substrate layers representing the strands 12. In one embodiment, the structure 26 represents the tube 16 and/or the wire 22, with the graphene layers 28 representing the coating 20 and the substrate layers 30 representing the overlapping turns of the sheet 18 to form the tube 16 and/or the wire 22. It is noted that each of these embodiment includes a plurality of the graphene layers 28 alternatively arranged with and/or between a plurality of the substrate layers 30. This alternating arrangement results in one or more of the internal graphene layers 28b. Advantageously, providing at least one of the internal graphene layers 28b enables the electrically conductive structure 26 to exhibit a higher ratio of graphene to substrate material than if only the exterior layers 28a, e.g., just an exterior coating, was included.

It is also to be appreciated that the ratio of graphene to the substrate material can be further tailored as desired. For example, there will be greater ratio of graphene to the substrate material if each of the strands 12 is individually coated by the graphene coating 14 while forming the bundle 10 than if only a few selected ones of the strands 12 are so coated. Similarly, the diameter, cross-sectional width, thickness, or other dimensions of the strands 12 and/or the sheet(s) 20 can be altered to change the number of the layers 28 and 30 and/or their relative amounts. Additionally, properties of the bundle 10, the tube 16, and/or the wire 22 can be altered to enable tailoring of the graphene to substrate ratio, such as the number of turns used to make the tube 16 and/or the wire 22, the number of strands 12 in the bundle 10, the composition of the strands 12 and/or the sheets 18, (e.g., as discussed herein, the strands 12 and the sheets 18 can be formed by structures including both graphene and the substrate material).

Figure 5:
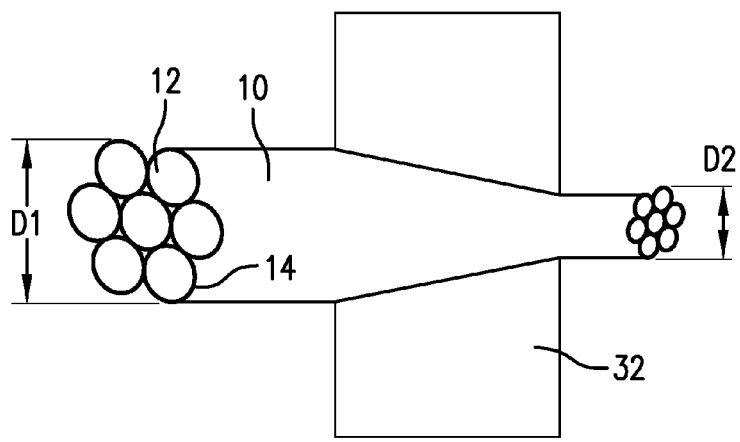
FIG. 5 schematically illustrates a process of changing at least one dimension of the electrically conductive structure of FIG. 1.

In order to set the dimensions of the wire bundle 10, the strands 12, the tube 16, the sheet(s) 20, the wire 22, etc. (collectively, the structure 26) e.g., to create a suitably dimensioned cable or wire for power and/or data transmission, the structure 26 can be first assembled as noted above, and then drawn, pressed, urged, or forced through a die. For example, as illustrated in FIG. 5, the bundle 10 has a first dimension D1 that is reduced to a second dimension D2 by compressing the strands 12 together as the bundle 10 passes through a die 32. It is to be appreciated that the die 32 can include or be replaced by other rams, dies, presses, rollers, etc. for changing the dimensions, including the shape, of the bundle 10. The other structures 26 (e.g., the strands 12, the tube 16, the sheet(s) 20, the wire 22, etc.) can be similarly processed with the die 32 in order to change the dimensions of the structures 26.

In addition to setting the desired dimensions of the bundle 10 for use in a power or signal transmission cable or the like, compression of the layers 28 and/or 30 (e.g., the strands 12 and/or the coating 14, turns of the sheet(s) 20 and/or the coating 22, etc.) together may also improve the mechanical properties of the structure 26 (e.g., of the wire bundle 10, the tube 28, the wire 22, etc.) and/or the bond between the graphene and the substrate material. Additionally, drawing the structure 26 can be used to assist in tailoring or setting the ratio of graphene to the substrate material. That is, the graphene coating 14 may not compress as readily as the substrate material, e.g., particularly if the graphene is disposed as a single atom-thick layer. In this way, the bulk of the change from the dimension D1 to the dimension D2 can be borne by substrate material. Additionally, as particularly useful for various embodiments below, the dimensions of the structures 26 can be reduced, which structures can then be utilized to create further electrically conductive structures.

In one embodiment the wires 22 are arranged in a bundle, effectively replacing the strands 12 in the bundle 10. The wires 22 in this modified bundle, in addition to have the internal alternating spiraled pattern of graphene and substrate, can be further coated with graphene, as noted above with respect to the strands 12, or a bundle of the wires 22 can be so coated in graphene. In one embodiment, one of the bundles 10, wires 22, strands 12, etc. are arranged as a core filling the cavity 24 of the tube 16. In one embodiment, multiple ones of the bundles 10 are formed and bundled together to form a yet larger bundle, e.g., essentially replacing the strands 12 in the arrangement of FIG. 1 to form a new, larger bundle, from a plurality of smaller bundles. For example, a plurality of individual nano-strands of substrate and graphene can be arranged in plurality of bundles, which are then bundled together to form a micro-scale bundle, and so on.

While the invention has been described with reference to an exemplary embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item.

What is claimed is:

1. An electrically conductive structure, comprising:
 a substrate arranged in a plurality of strands and formed from a substrate material and at least one graphene layer coated circumferentially on one or more of the strands of the plurality of strands, the graphene layer being a single atom-thick layer of carbon atoms arranged in a hexagonal pattern, the substrate and the at least one graphene layer having an axial direction;
 wherein a first cross-section taken along the axial direction of the substrate and the at least one graphene layer includes:
  a plurality of layers of the substrate material; and
  at least one internal layer of the graphene alternatingly disposed between the plurality of layers of the substrate material.

2. The electrically conductive structure of claim 1, wherein the graphene is in an amount of about 5% to 40% per unit area with respect to a second cross-section of the electrically conductive structure perpendicular to the first cross-section.

3. The electrically conductive structure of claim 2, wherein the graphene is in an amount of about 15% to 30% per unit area with respect to the second cross-section.

4. The electrically conductive structure of claim 1, wherein the strands are arranged to form the electrically conductive structure as a cable, wire, bundle of wires, ribbon, or a combination including at least one of the foregoing.

5. The electrically conductive structure of claim 1, wherein at least one of the plurality of strands is formed from a sheet at least partially comprising the substrate material, the sheet including a coating made from the graphene disposed thereon, the sheet and the coating being rolled or wrapped to form the at least one of the plurality of strands.

6. The electrically conductive structure of claim 1, wherein at least one of the plurality of strands is made from a plurality of second strands bundled together, the second strands being formed of the substrate material, the graphene, or a combination including at least one of the foregoing.

7. An electrically conductive structure, comprising: a substrate arranged as one or more rolled or wrapped sheets made from a substrate material and a coating made from a graphene layer disposed on at least one of the one or more rolled or wrapped sheets, the graphene layer being a single atom-thick layer of carbon atoms arranged in a hexagonal pattern, the rolled sheets of the substrate and the graphene layer having an axial direction,
 wherein a first cross-section taken along the axial direction of the rolled substrate and graphene layer includes:
  a plurality of layers of the substrate material; and
  at least one internal layer of the graphene alternatingly disposed between the plurality of layers of the substrate material.

8. The electrically conductive structure of claim 7, wherein the one or more rolled or wrapped sheets form a tube or wire.

9. The electrically conductive structure of claim 7, wherein the electrically conductive structure takes the form of a ribbon.

10. The electrically conductive structure of claim 7, wherein the substrate material is copper, aluminum, nickel, steel, or a combination including at least one of the foregoing.

11. The electrically conductive structure of claim 7, wherein the graphene is in an amount of about 5% to 40% per unit area with respect to a second cross-section of the electrically conductive structure perpendicular to the first cross-section.

12. The electrically conductive structure of claim 11, wherein the graphene is in an amount of about 15% to 30% per unit area with respect to the second cross-section.

13. The electrically conductive structure of claim 1, wherein the substrate material is copper, aluminum, nickel, steel, or a combination including at least one of the foregoing.

\* \* \* \* \*